US012772914B2

(12) United States Patent
Zhang et al.

(10) Patent No.: US 12,772,914 B2
(45) Date of Patent: Oct. 20, 2026

(54) DISPLAY PANEL AND DISPLAY DEVICE

(71) Applicant: HKC CORPORATION LIMITED, Shenzhen (CN)

(72) Inventors: Rong Zhang, Shenzhen (CN); Junfeng Xie, Shenzhen (CN)

(73) Assignee: HKC Corporation Limited, Shenzhen (CN)

( * ) Notice: Subject to any disclaimer, the term of this patent is extended or adjusted under 35 U.S.C. 154(b) by 370 days.

(21) Appl. No.: 18/733,952

(22) Filed: Jun. 5, 2024

(65) Prior Publication Data

US 2025/0029962 A1 Jan. 23, 2025

(30) Foreign Application Priority Data

Jul. 21, 2023 (CN) ......................... 202310902974.8

(51) Int. Cl.

| | |
|---|---|
| ***H01L 25/075*** | (2006.01) |
| ***H10D 86/40*** | (2025.01) |
| ***H10D 86/60*** | (2025.01) |
| ***H10H 20/857*** | (2025.01) |
| ***H10H 29/14*** | (2025.01) |
| ***H10W 90/00*** | (2026.01) |

(52) U.S. Cl.

CPC .......... *H10W 90/00* (2026.01); *H10D 86/443* (2025.01); *H10D 86/60* (2025.01); *H10H 20/857* (2025.01); *H10H 29/142* (2025.01)

(58) Field of Classification Search

CPC .... H10H 29/012; H10H 29/854; H10H 29/37; H10H 29/39; H10H 29/8552; H10H 29/856; H10H 29/45; G09F 9/3026

See application file for complete search history.

(56) References Cited

FOREIGN PATENT DOCUMENTS

| | | | |
|---|---|---|---|
| CN | 110349942 | A | 10/2019 |
| CN | 113763823 | A | 12/2021 |
| CN | 113921539 | A | 1/2022 |
| CN | 111640377 | B | 6/2022 |
| CN | 217718361 | U | 11/2022 |
| TW | 201539405 | A | 10/2015 |

OTHER PUBLICATIONS

Chinese First Office Action, Chinese Application No. 202310902974.8, mailed Oct. 28, 2023 (13 pages).
Chinese Second Office Action, Chinese Application No. 202310902974.8, mailed Nov. 29, 2023 (14 pages).
Chinese Notification to Grant Patent Right for Invention, Chinese Application No. 202310902974.8, mailed Dec. 16, 2023 (5 pages).

*Primary Examiner* — Elmito Breval

(57) ABSTRACT

The present disclosure provides a display panel and a display device. The display panel includes at least two first panels and a second panel. The first panels are spliced with a gap defined. The first panel includes a first pixel region and a second pixel region, the second pixel region being near the gap. The second pixel region includes second pixel units. The second panel includes a third pixel region and two fourth pixel regions, the third pixel region facing the gap, and the two fourth pixel regions being located on opposite sides of the third pixel region and overlapping with the second pixel regions. The fourth pixel region includes virtual pixel units, and the virtual pixel units faces and overlaps with the second pixel units in a one-to-one correspondence, and light from each second pixel unit is capable of passing through a corresponding virtual pixel unit.

20 Claims, 8 Drawing Sheets

DISPLAY PANEL AND DISPLAY DEVICE

CROSS REFERENCE TO REPLATED APPLICATIONS

The present disclosure claims priority of Chinese Patent Application No. 202310902974.8, filed on Jul. 21, 2023, the entire contents of which are hereby incorporated by reference in its entirety.

TECHNICAL FIELD

The present disclosure relates to the field of display technologies, and in particular to display panel and a display device.

BACKGROUND

With the development of optoelectronic display technologies and semiconductor manufacturing technologies, the Micro LED display technology is considered to be the best display technology in the future due to its advantages of high stability, long life, better display effect, and higher resolution.

Currently, large-size Micro LED display panels cannot be directly manufactured due to the immaturity of mass transfer technology, and the large-size display panels usually suffer from uneven display. Therefore, a large-size display panel is usually realized by splicing multiple panels.

However, in such a multi-screen display device, there are splicing seams in the splicing region, resulting in dark lines or discontinuous display images when the display panels are displayed.

SUMMARY OF THE DISCLOSURE

The present disclosure provides a display panel and a display device, aimed to solve the problems in the related art that there are splicing seams in the splicing region resulting in dark lines or discontinuous display images when the display panels are displayed.

To solve the above technical problem, a first technical solution provides by the present disclosure is to provide a display panel. The display panel includes: at least two first panels; wherein the at least two first panels are spliced, and a gap is defined between each adjacent two of the at least two first panels; and a second panel, arranged between the adjacent two of the at least two first panels; wherein for each of the adjacent two of the at least two first panels, the first panel includes a first pixel region and a second pixel region, the second pixel region being located on a side of the first pixel region near the gap; the first pixel region includes a plurality of first pixel units, the second pixel region includes a plurality of second pixel units; the second panel includes a third pixel region and two fourth pixel regions, the third pixel region facing the gap, and the two fourth pixel regions being located on opposite sides of the third pixel region and overlapping with the second pixel regions on opposite sides of the gap; the third pixel region includes a plurality of third pixel units, and each of the two fourth pixel regions includes a plurality of virtual pixel units; the plurality of virtual pixel units faces and overlaps with the plurality of second pixel units in a one-to-one correspondence, and light from each of the plurality of second pixel units is capable of passing through a corresponding virtual pixel unit.

To solve the above technical problem, a second technical solution provides by the present disclosure is to provide a display device. The display device includes: the display panel as above, for displaying an image; and a control module, electrically connected to the display panel and configured to control the display panel.

To solve the above technical problem, a third technical solution provides by the present disclosure is to provide a display panel. The display panel includes: two first panels; wherein the at least two first panels are spliced, and a gap is defined between the two first panels; and a second panel, arranged on the two first panels; wherein two overlapping regions are defined on opposites sides of the second panel, and in each overlapping region, a part of the second panel is overlapped with a part of a corresponding first panel; wherein in each overlapping region, the second panel is arranged with a plurality of virtual pixel units with no light-emitting units, and the corresponding first pixel is arranged with a plurality of pixel units each with a light-emitting unit; the plurality of virtual pixel units face the plurality of pixel units in a one-to-one correspondence; light from each of the plurality of pixel units is capable of passing through a corresponding virtual pixel unit; in a region other than the two overlapping regions on the second panel, the second panel is further arranged with a plurality of other pixel units each with a light-emitting unit.

BRIEF DESCRIPTION OF THE DRAWINGS

In order to more clearly illustrate the technical solutions in the embodiments of the present disclosure, the following is a brief description of the drawings required for the description of the embodiments, and it will be obvious that the drawings in the following description are only some embodiments of the present disclosure, and that other drawings can be obtained from these drawings without creative work for those skilled in the art.

REFERENCE NUMERALS

Figure 1:
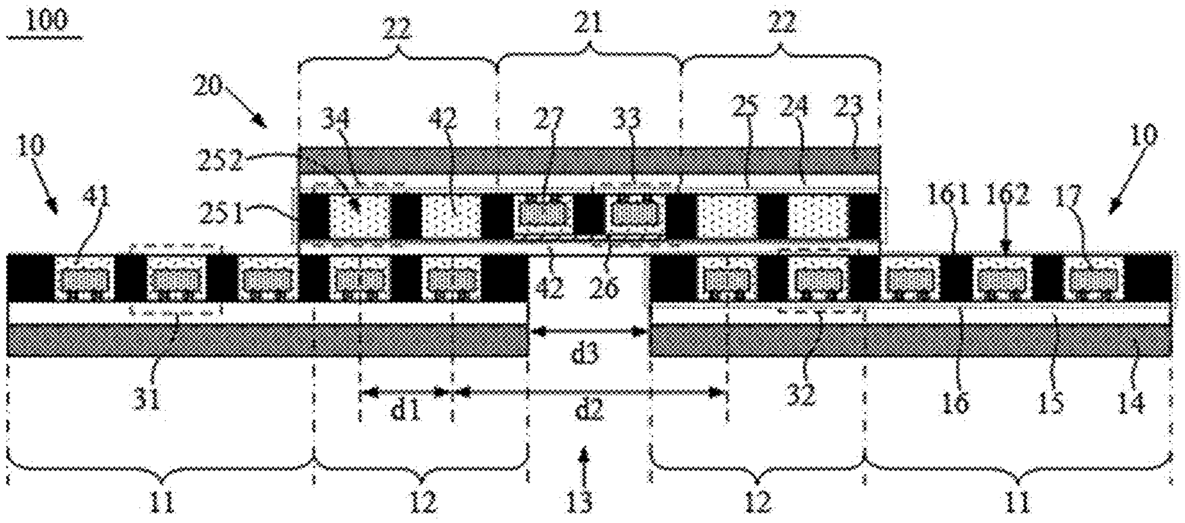
FIG. 1 is a structural schematic view of a structure of a display panel according to a first embodiment of the present disclosure.

100—display panel; 10—first panel; 11—first pixel region; 12—second pixel region; 13—gap; 14—first substrate; 15—first circuit layer; 150—pixel driving circuit; 151—driving signal line; 151*a*—operating voltage signal line; 151*b*—common electrode signal line; 152—signal connection line; 152*a*—first connection line; 152*b*—second connection line; 153—pad; 153*a*—first pad; 153*b*—second pad; 154—adapter hole; 154*a*—first adapter hole; 154*b*—second adapter hole; 16—first pixel definition layer; 161—first black matrix; 162—first pixel opening; 17—first light-emitting unit; 181—first reflective layer; 182—second reflective layer; 20—second panel; 21—third pixel region; 22—fourth pixel region; 23—second substrate; 24—second circuit layer; 25—second pixel definition layer; 251—second black matrix; 252—second pixel opening; 26—light-shielding layer; 27—second light-emitting unit; 31—first pixel unit; 32—second pixel unit; 33—third pixel unit; 34—virtual pixel unit; 41—first light guide layer; 42—second light guide layer; 50—signal input terminal; 51—first input terminal; 52—second input terminal; 53—third input terminal; d1—first pixel distance; d2—second pixel distance; d3—gap width; 200—control module.

DETAILED DESCRIPTION

The following description, in conjunction with the accompanying drawings of the specification, provides a detailed description of the technical solutions in embodiments of the present disclosure.

In the following description, specific details such as particular system structures, interfaces, techniques, and the like are presented for the purpose of illustration and not for the purpose of limitation, in order to provide a thorough understanding of the present disclosure.

The technical solutions in the embodiments of the present disclosure will be clearly and completely described below in conjunction with the accompanying drawings in the embodiments of the present disclosure, and it is obvious that the described embodiments are only a part of the embodiments of the present disclosure, but not all of them. Based on the embodiments in the present disclosure, all other embodiments obtained by those skilled in the art without creative labor fall within the scope of the present disclosure.

The terms “first”, “second”, and “third” in the present disclosure are intended for descriptive purposes only and are not to be construed as indicating or implying relative importance or implicitly indicating the number of indicated technical features. Therefore, a feature defined with “first”, “second”, or “third” may explicitly or implicitly include at least one such feature. In the description of the present disclosure, “multiple” or “multiple” means at least two, e.g., two, three, etc., unless otherwise expressly and specifically limited. All directional indications (e.g., up, down, left, right, forward, backward . . . ) in the present disclosure are intended only to explain the relative position relationship, movement, etc., between components in a particular posture (as shown in the accompanying drawings), and if that particular posture is changed, the directional indications are changed accordingly. In addition, the terms “include” and “have”, and any variations thereof are intended to cover non-exclusive inclusion. For example, a process, method, system, product, or apparatus including a series of steps or units is not limited to the listed steps or units, but optionally further includes steps or units not listed, or optionally further includes other steps or units inherent to the process, method, product, or apparatus.

References herein to “embodiment” mean that particular features, structures, or characteristics described in connection with an embodiment may be included in at least one embodiment of the present disclosure. The presence of the phrase at various positions in the specification does not necessarily mean the same embodiment, nor is it a separate or alternative embodiment that is mutually exclusive with other embodiments. It is understood, both explicitly and implicitly, by those skilled in the art that the embodiments described herein may be combined with other embodiments.

The present disclosure is described in detail below in conjunction with the accompanying drawings and embodiments.

Referring to FIG. 1, FIG. 1 is a structural schematic view of a structure of a display panel according to a first embodiment of the present disclosure. In the embodiments, a display panel 100 is provided, the display panel 100 including at least two first panels 10 and a second panel 20; where the at least two first panels 10 are spliced and a gap 13 is defined between two adjacent first panels 10; the second panel 20 is arranged between the two adjacent first panels 10 to form the display panel 100 by splicing. The display panel 100 may meet a large-size requirement, thereby realizing a seamless splicing display.

Specifically, each of the at least two first panels 10 may be a panel with a bezel-less edge; the first panel 10 includes a first pixel region 11 and a second pixel region 12, the second pixel region 12 being located on a side of the first pixel region 11 near the gap 13. That is, a region on the first panel 10 near the gap 13 is the second pixel region 12, and the other region is the first pixel region 11. The second panel 20 includes a third pixel region 21 and two fourth pixel regions 22, the third pixel region 21 facing the gap 13, and the two fourth pixel regions 22 being located on opposite sides of the third pixel region 21 and overlapping with the second pixel regions 12 on opposite sides of the gap 13. It can be understood that edge portions on the opposite sides of the second panel 20 are arranged overlapping with edge portions of the two adjacent first panels 10 near the gap 13, and the first panel 10 and the second panel 20 can support each other by means of the edge overlap setting, so as to make the connection between the first panel 10 and the second panel 20 more reliable, thereby avoiding an abnormal picture display due to the second panel 20 being shifted or collapsed. Further, to avoid the second panel 20 obscuring the display of the first panel 10 in the overlapping region, the second pixel region 12 has a light transmittance property that enables the light from the second pixel region 12 on the first panel 10 to pass through the second panel 20, so as to enable the second panel 20 to display an image together with the first panel 10, thereby eliminating the display of a dark line or a discontinuous picture due to the gap 13 formed by the splicing of the first panel 10.

Specifically, on the first panel 10, the first pixel region 11 includes multiple first pixel units 31, the second pixel region 12 includes multiple second pixel units 32, and the multiple first pixel units 31 and the multiple second pixel units 32 are arranged in an array on the first panel 10. On the second panel 20, the third pixel region 21 includes multiple third pixel units 33, the fourth pixel region 22 includes multiple virtual pixel units 34, and the multiple third pixel units 33 and the multiple fourth pixel units are arranged in an array on the second panel 20. The multiple virtual pixel units 34 faces and overlaps with the multiple second pixel units 32 in a one-to-one correspondence. The specific structure of the virtual pixel unit 34 is substantially the same as that of the second pixel unit 32, the difference being that the virtual pixel unit 34 is not arranged with a light-emitting unit and does not have the function of self-illumination. Rather, the outgoing light from the second pixel unit 32 is emitted into the corresponding virtual pixel unit 34 and emitted from the virtual pixel unit 34. That is, the second pixel unit 32 realizes the light emitting function, and the virtual pixel unit 34 realizes the display function, such that in the overlapping region of the first panel 10 and the second panel 20, the light of the pixel unit of the first panel 10 can pass through the virtual pixel unit 34 of the second panel 20 to display the corresponding pixel point, which not only prevents the problem of black lines due to the overlap blocking the light of the second pixel region, but also realizes the pixel-level display so as to ensure that the display contrast of the overlapping region is the same as that of the other non-overlapping regions, thereby making the image display effect of the overlapping region and the other non-overlapping regions consistent, and thus avoiding the problem of contrast degradation due to overlapping.

Specifically, the display panel 100 forms a large-size display region through the setting of the first pixel unit 31, the second pixel unit 32, the virtual pixel unit 34, and the third pixel unit 33, thereby realizing a large-size display; by making the third pixel unit 33 arranged facing the gap 13, and by making the virtual pixel unit 34 arranged overlapping with the second pixel unit 32, it is possible to make the first pixel region 11, the second pixel region 12, and the third pixel region 21 to be seamlessly connected, for realizing the large-size display region without splicing gaps to complete the display screen, thereby eliminating black lines or discontinuities in the screen caused by splicing gaps; further, by arranging the virtual pixel units 34 in the overlapping region of the second panel 20 that are in one-to-one correspondence with the second pixel units 32, a pixel-level display in the overlapping region may be realized, such that the display contrast in the overlapping region tends to be consistent with the display contrast in the non-overlapping region, thereby making the display effect of the overall picture substantially consistent.

Figure 2:
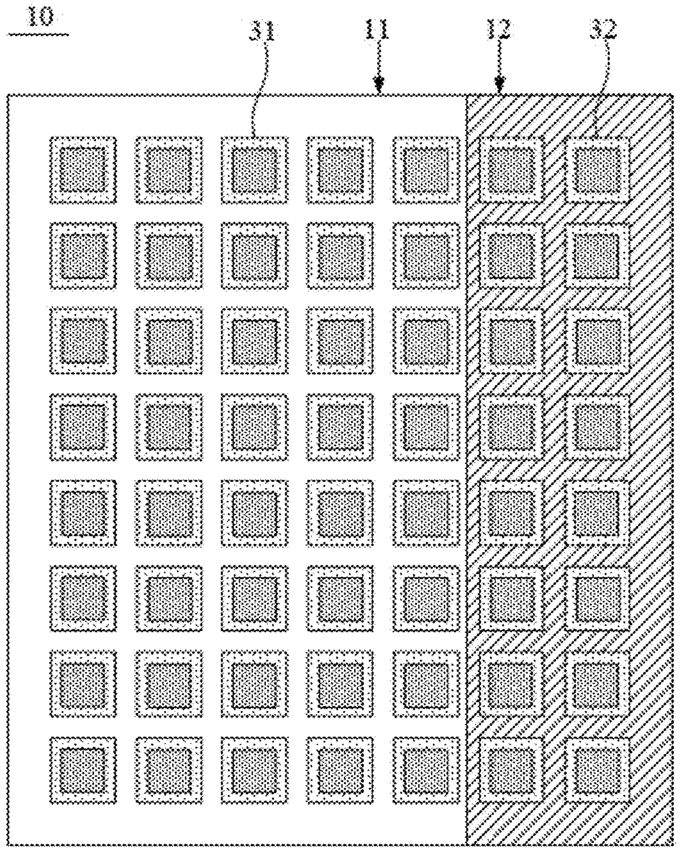
FIG. 2 is a schematic view of a planar structure of a first panel according to a first embodiment of the present disclosure.
Figure 3:
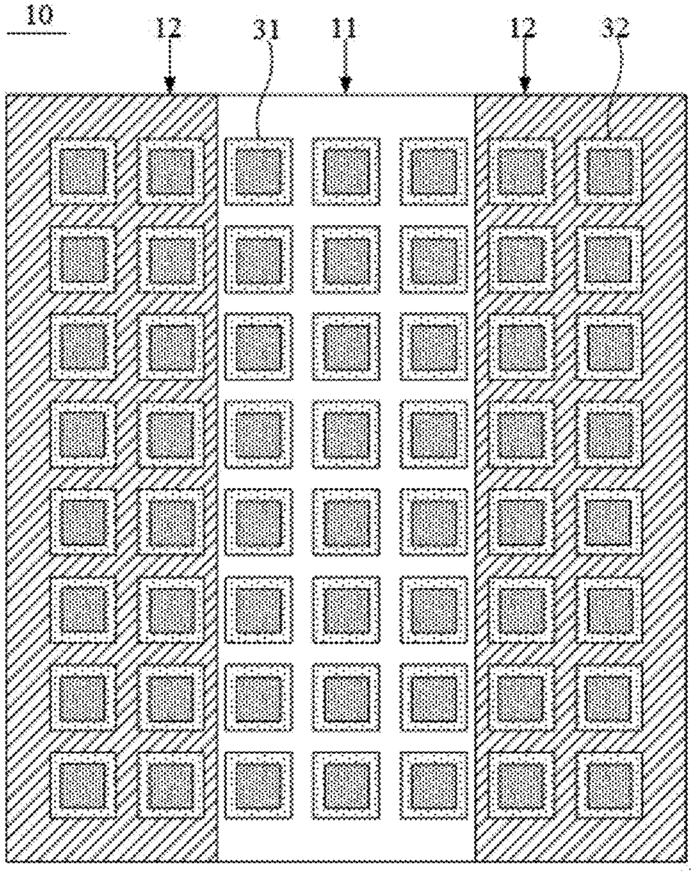
FIG. 3 is a schematic view of a planar structure of a first panel according to a second embodiment of the present disclosure.
Figure 4:
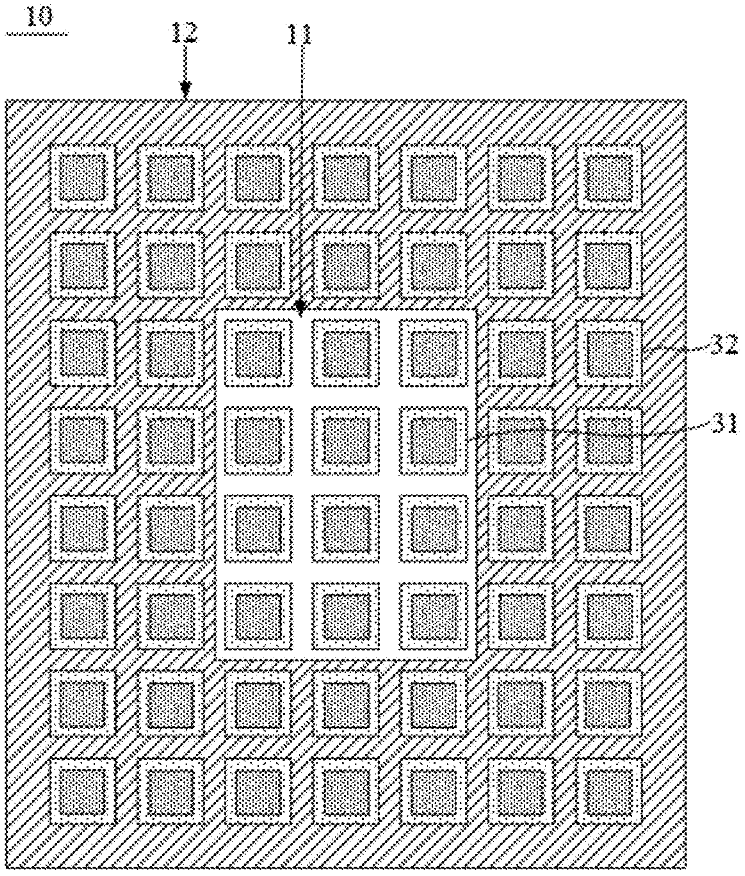
FIG. 4 is a schematic view of a planar structure of a first panel according to a third embodiment of the present disclosure.

Further referring to FIGS. 2-4, FIG. 2 is a schematic view of a planar structure of a first panel according to a first embodiment of the present disclosure, FIG. 3 is a schematic view of a planar structure of a first panel according to a second embodiment of the present disclosure, and FIG. 4 is a schematic view of a planar structure of a first panel according to a third embodiment of the present disclosure. In specific embodiments, the second pixel region 12 and the fourth pixel region 22 are overlapped, i.e., the second pixel region 12 and the fourth pixel region 22 are located in the overlapping region of the first panel 10 and the second panel 20, and the second pixel unit 32 is arranged in the overlapping region of the first panel 10 and the second panel 20. Specifically, the first pixel region 11 and the second pixel region 12 of the first panel 10 may be designed according to the splicing design requirements of the display panel 100. For example, as shown in FIG. 2, in a case where only one side edge of the first panel 10 is required to be spliced, the second pixel region 12 is only arranged at the side edge that is required to be spliced, and the other region is set as the first pixel region 11. For example, as shown in FIG. 3, in a case where opposite side edges of the first panel 10 are required to be spliced with other panels, the second pixel region 12 is arranged in each of both edge portions of the first panel 10 and the first pixel region 11 is arranged in the middle portion of the first panel 10. For example, as shown in FIG. 4, in a case where all the four sides of the first panel 10 are required to be spliced with other panels, the first pixel region 11 is arranged in the middle region, and the second pixel region 12 is arranged at the periphery of the first pixel region 11.

Specifically, a width size of the second pixel region 12 may be set according to the number of columns or rows of the second pixel units 32; further, along a direction of the first pixel region 11 approaching the gap 13, the second pixel region 12 includes at least two columns of the second pixel units 32 to increase the width of the overlapping region between the first panel 10 and the second panel 20, thereby increasing the width of the second panel 20, which may effectively prevent the second panel 20 from breaking and increase the contact area between the second panel 20 and the first panel 10, such that the joint area between the second panel 20 and the first panel 10 may be increased, and thus the splicing stability of the second panel 20 and the first panel 10 may be effectively improved, preventing display abnormalities caused by the second panel 20 shifting. Specifically, the number of columns of the second pixel units 32 may be set according to actual needs, such as two, three, four, five, six, eight, ten, etc., without specific limitation herein. It should be noted that all of the above widths refer to the width of the panel in a direction perpendicular to the gap 13.

Referring back to FIG. 1, specifically, the distance between two adjacent columns of pixel units on the first panel 10 is a first pixel distance d1; the distance between two columns of second pixel units 32 on opposite sides of the gap 13 between the two adjacent first panels 10 is a second pixel distance d2, and the second pixel distance d2 is an integer multiplier of the first pixel distance d1, such that the width of the third pixel region 21 is an integer multiple of the first pixel distance d1, thereby facilitating the layout of the third pixel units 33. Specifically, the distance between two adjacent columns of pixel units on the second panel 20 is the same as the first pixel distance d1, i.e., the distance between two adjacent pixel units on the second panel 20 is equal to the distance between two adjacent pixel units on the first panel 10, and thus, by making the second pixel distance d2 an integer multiple of the first pixel distance d1, the width of the third pixel region 21 is such that exactly an integer number of columns of the third pixel units 33 can be provided, thereby making the arrangement layout of the third pixel units 33 of the third pixel region 21 consistent with that of the pixel units on the first panel 10, such that the display panel 100 is able to maintain consistency of the display in each region; further, by making the arrangement layout of the pixel units on the second panel 20 consistent with that of the pixel units on the first panel 10, it is possible to simplify the manufacturing process when preparing the first panel 10 and the second panel 20. In addition, by making the second pixel distance d2 an integer multiple of the first pixel distance d1, it is also possible to make the layout of the pixel circuits of the first panel 10 consistent with the layout of the pixel circuits of the second panel 20, which is favorable to the layout of the pixel circuits and the simplification of the process.

Specifically, in the embodiments, the first panel 10 and the second panel 20 may be attached to each other by a sealing adhesive layer to fix the relative position between the first panel 10 and the second panel 20, thereby improving the stability of the splicing of the display panel 100, which may avoid a breakage or abnormality of the picture caused by the relative displacement between the first panel 10 and the second panel 20 after splicing. The sealing adhesive layer covers the second panel 20. The sealing adhesive may be applied to the second panel 20 as a whole during splicing, and then the second panel 20 is attached to the first panel 10 to simplify the process of the sealing adhesive layer. The sealing adhesive layer may be specifically a transparent organic resin material to enable light from the second pixel unit 32 to pass through the sealing adhesive layer into the virtual pixel unit 34. Further, the sum of the thicknesses of the first panel 10, the sealing adhesive layer, and the second panel 20 is less than 1 mm to make the overall thickness of the first panel 10 and the second panel 20 in the overlapping region less than 1 mm, thereby reducing the difference between the thickness of the display panel 100 in the overlapping region and the thickness of the thickness of the other regions, and thus reducing the effect of splicing on the display uniformity of the display panel 100 and improving the display effect.

Figure 5:
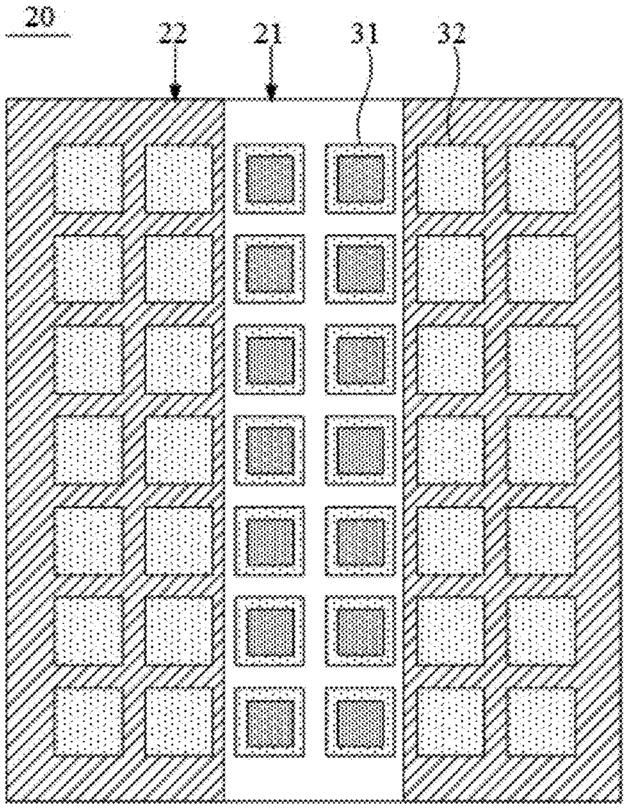
FIG. 5 is a schematic view of a planar structure of a second panel according to some embodiments of the present disclosure.

Referring to FIGS. 1 and 5, FIG. 5 is a schematic view of a planar structure of a second panel according to some embodiments of the present disclosure. In the embodiments, the second panel 20 includes a third pixel region 21 and two fourth pixel regions 22, the third pixel region 21 facing the gap 13 between the two adjacent first panels 10, and the fourth pixel region 22 being located on opposite sides of the gap 13 and overlapping with the second pixel regions 12. Specifically, the width of the third pixel region 21 is equal to the sum of the width of the gap 13 and the width of retaining walls of black matrixes on both sides of the gap 13. The width of the gap 13 may be set specifically according to the splicing requirements, but it is necessary to satisfy that the width of the third pixel region 21 is suitable for setting integer columns of the third pixel units 33. Specifically, the number of columns of the third pixel units 33 may be set according to the width of the gap 13 and the first pixel distance d1, where a gap width d3 of the gap 13 may be specifically 5~100 mm, which may be set according to the actual splicing requirements, such as 5 mm, 10 mm, 15 mm, 20 mm, 25 mm, 30 mm, 40 mm, 50 mm, 60 mm, 70 mm, 80 mm, 90 mm, 100 mm, etc., which may not only reduce the requirement for the splicing gap 13, but also facilitate the transfer and binding of the light-emitting units in this size range, thereby improving the product yield.

Specifically, in a similar manner as the second pixel region 12, along a direction of the third pixel region 21 away from the gap 13, the fourth pixel region 22 includes at least two columns of virtual pixel units 34 to increase the width of the overlapping region between the second panel 20 and the first panel 10, and increase the width of the second panel 20 in the direction perpendicular to the gap 13, thereby effectively preventing breaking of the second panel 20 and increasing the contact area between the second panel 20 and the first panel 10, which may further improve the adhesive stability of the first panel 10 and the second panel 20 and avoid the display panel 100 from separating or shifting the first panel 10 and the second panel 20 due to external force.

It can be understood that, similar to the setting method of the second pixel region 12, the fourth pixel region 22 is also arranged in the overlapping region of the second panel 20 and the first panel 10, which may not be limited to being arranged on the opposite sides of the third pixel region 21, but may be arranged on three side edges or the four side edges around the third pixel region 21, which may be determined according to the actual splicing needs.

In the embodiments, the first panel 10 includes a first substrate 14, a first circuit layer 15, and a first pixel definition layer 16 sequentially stacked. The first substrate 14 is configured to carry the first circuit layer 15 and the first pixel definition layer 16; the first circuit layer 15 is disposed on a side of the first substrate 14 and is configured to provide a drive current signal to the first pixel definition layer 16; and the first pixel definition layer 16 is disposed on a side of the first circuit layer 15 away from the first substrate 14 and electrically connected to the first circuit layer 15 to receive the drive current signal for displaying an image.

The first substrate 14 may be a glass substrate or an organic material substrate, etc., which may be set according to actual needs. The thickness of the first substrate 14 may be 0.3 to 0.6 mm, such as 0.5 mm, to ensure the overall strength of the display panel 100, thereby avoiding breakage due to external forces while ensuring that the overall thickness of the display panel 100 in the overlapping region is less than 1 mm.

Figure 6:
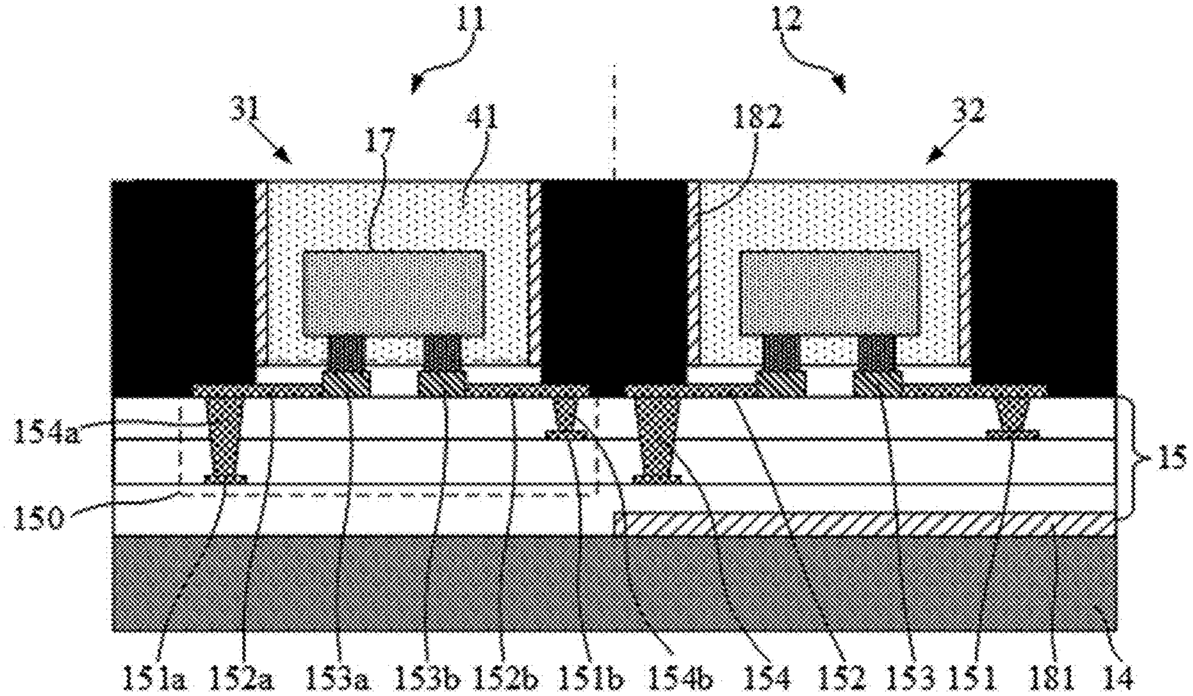
FIG. 6 is a schematic view of a partial sectional structure of a first panel according to some embodiments of the present disclosure.

Referring to FIGS. 1 and 6, FIG. 6 is a schematic view of a partial sectional structure of a first panel according to some embodiments of the present disclosure. The first circuit layer 15 includes multiple pixel driving circuits 150, the pixel driving circuits 150 being in one-to-one correspondence with and electrically connected to the pixel units on the first panel 10 to provide the drive current signals to the pixel units. Specifically, the pixel driving circuit 150 includes a basic driving circuit (not shown), a driving signal line 151, a signal connection line 152, and a pad 153. The driving signal line 151 includes an operating voltage signal line (VDD signal line) 151*a* and a common electrode signal line (VSS signal line) 151*b*. The signal connection line 152 includes a first connection line 152*a* and a second connection line 152*b*, the first connection line 152*a* is electrically connected to the VDD signal line 151*a*, and the second connection line 152*b* is electrically connected to the VSS signal line 151*b*. The pad 153 is arranged in an uppermost layer of the first circuit layer 15, and the pad 153 includes a first pad 153*a* and a second pad 153*b*; the first pad 153*a* is electrically connected to the first connection line 152*a*, and the second pad 153*b* is electrically connected to the second connection line 152*b*. That is, the VDD signal line 151*a* is electrically connected to the first pad 153*a* through the first connection line 152*a*, and the VSS signal line 151*b* is electrically connected to the second pad 153*b* through the second connection line 152*b*. Specifically, the first connection line 152*a* is electrically connected to the VDD signal line 151*a* through a first adapter hole 154*a*, and the second connection line 152*b* is electrically connected to the VSS signal line 151*b* through a second adapter hole 154*b*. It can be understood that, with the above setup, the first pad 153*a* is electrically connected to the VDD signal line 151*a*, and the second pad 153*b* is electrically connected to the VSS signal line 151*b*, for binding a first electrode and a second electrode of a first light-emitting unit 17.

As shown in FIG. 1, the first pixel definition layer 16 forms the first pixel unit 31 and the second pixel unit 32. Specifically, the first pixel definition layer 16 includes a first black matrix 161, the first light-emitting unit 17, and a first light guide layer 41; the first black matrix 161 defines multiple first pixel openings 162, and the first pixel openings 162 specifically correspond to the first pixel units 31 and the second pixel units 32 one by one; the shape and size of each first pixel opening 162 match the shape and size of a corresponding pixel unit, which may be specifically set according to the needs of the pixel units, such as a rectangle, a square, a triangle, a rhombus, a parallelogram, or a polygon. The first light-emitting unit 17 is arranged within each pixel opening to form the first pixel units 31 and the second pixel units 32. It can be understood that the pixel unit located in the first pixel region 11 is the first pixel unit 31, and the pixel unit located in the second pixel region 12 is the second pixel unit 32. The first light-emitting unit 17 may be a current-driven light-emitting device such as an LED, Mini LED, or Micro LED. The first light-emitting unit 17 may include a red light-emitting unit, a green light-emitting unit, and a blue light-emitting unit, and the light-emitting units of the three colors are arranged in a predetermined pattern so as to achieve a full-color display.

Further, the first light guide layer 41 is filled in the first pixel opening 162 for gathering light in the first pixel opening 162; specifically, the first light guide layer 41 is made of a transparent material, such as an organic resin material, and has a refractive index of 1.4 to 1.7, so as to be able to gather the light emitted by the first light-emitting unit 17, thereby enabling more light to be emitted from the first pixel openings 162, and thus increasing the transmittance rate, enhancing the brightness of the display panel 100, and reducing the power consumption.

As shown in FIG. 1, in the embodiments, the second panel 20 includes a second substrate 23, a second circuit layer 24, and a second pixel definition layer 25 sequentially stacked. The second substrate 23 is configured to carry the second circuit layer 24 and the second pixel definition layer 25, the second circuit layer 24 is disposed on a side of the second substrate 23 to provide a drive current signal to the second pixel definition layer 25; and the second pixel definition layer 25 is disposed on a side of the second circuit layer 24 away from the second substrate 23 and electrically connected to the second circuit layer 24 to receive the drive current signal for displaying an image.

The material of the second substrate 23 may be the same as that of the first substrate 14, and the thickness of the second substrate 23 is 0.2 to 0.4 mm, such as 0.3 mm, to reduce the overall thickness of the panel in the overlapping region for making the display brightness of the overlapping region basically the same as that of the other regions, and making the display brightness of the first panel 10 basically the same as that of the second panel 20, which is conducive to the homogeneity of the brightness of the display panel 100.

Further, on the second substrate 23, the third pixel region 21 is further arranged with a light-shielding layer 26, which may be made of a light-absorbing material that is impervious to light or a reflective material for preventing the light in the third pixel region 21 from leaking from the back of the panel, so as to improve the display effect; the light-shielding layer 26 may be selected from a reflective material, such as a metal oxide material, which may reflect the light in the third pixel region 21 for improving the utilization of light and may dissipate heat from the third pixel region 21, thereby mitigating the problem of heat generation of the second panel 20.

The specific structure and function of the second circuit layer 24 is the same as or similar to the specific structure and function of the first circuit layer 15, and the same technical effect may be realized, as described above with respect to the first circuit layer 15, which will not be repeated herein.

The second pixel definition layer 25 forms the third pixel unit 33 and the virtual pixel unit 34. Specifically, the second pixel definition layer 25 includes a second black matrix 251, a second light-emitting unit 27, and a second light guide layer 42; the second black matrix 251 defines multiple second pixel openings 252, and the second pixel openings 252 specifically correspond to the third pixel units 33 and the virtual pixel units 34 one by one; the shape and size of each second pixel opening 252 match the shape and size of a corresponding pixel unit, which may be specifically set according to the needs of the pixel units, such as a rectangle, a square, a triangle, a rhombus, a parallelogram, or a polygon. The second pixel openings 252 located in the third pixel region 21 are each arranged with the second light-emitting unit 27 to form the third pixel units 33, and the second pixel openings 252 located in the fourth pixel region 22 are not arranged with any light-emitting unit, i.e., the second pixel opening 252 located in the fourth pixel region 22 is vacant to form the virtual pixel unit 34. The second light-emitting unit 27 may be a current-driven light-emitting device, such as an LED, Mini LED, or Micro LED. The second light-emitting unit 27 may include a red light-emitting unit, a green light-emitting unit, and a blue light-emitting unit, and the light-emitting units of the three colors are arranged in a predetermined pattern so as to achieve a full-color display.

Further, the second light guide layer 42 is filled in the second pixel opening 252 for gathering light in the second pixel opening 252; specifically, the second light guide layer 42 is made of a transparent organic material with a refractive index of 1.4 to 1.7, so as to be able to gather the light emitted by the second light-emitting unit 27 and light in the virtual pixel unit 34, thereby enabling more light to be emitted from the second pixel openings 252, and thus enhancing the transmittance rate of the second panel 20. That is, in the embodiments, by filling the first light guide layer 41 and the second light guide layer 42 in each of the pixel units for enhancing the transmittance rate of the display panel 100, the brightness of the display panel 100 may be enhanced, and the power consumption may be reduced.

In the embodiments, the first panel 10 is in a top light-emitting mode, i.e., the light output direction of the first panel 10 is in a direction of the first light-emitting unit 17 away from the first substrate 14; the second pixel definition layer 25 of the second panel 20 is disposed on the side of the second substrate 23 close to the first panel 10, and thus the second panel 20 is in a bottom light-emitting mode, i.e., the light output direction of the second panel 20 is in a direction of the second pixel definition layer 25 approaching the second substrate 23, and the light is emitted after passing through the second substrate 23.

Figure 7:
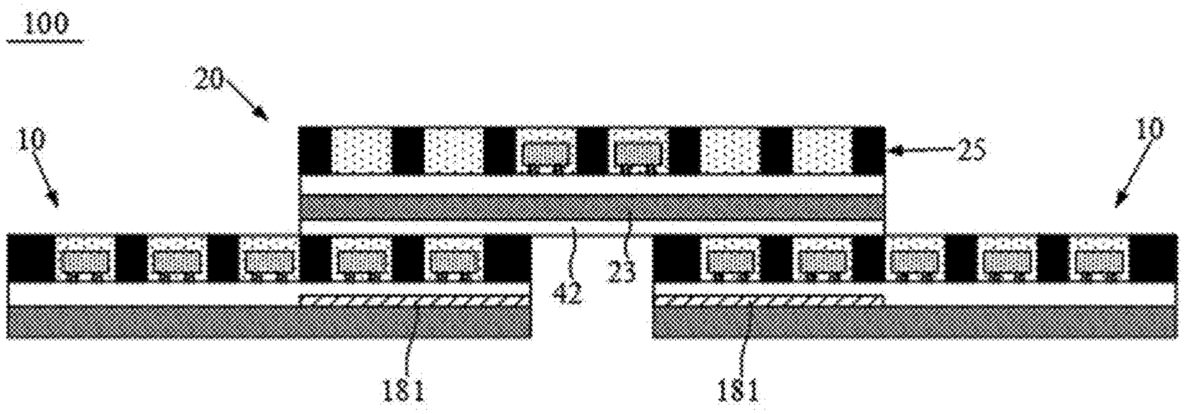
FIG. 7 is a structural schematic view of a display panel according to a second embodiment of the present disclosure.

Referring to FIG. 7, FIG. 7 is a structural schematic view of a display panel according to a second embodiment of the present disclosure. In the embodiment, the second panel 20 and the first panel 10 are both in a top light-emitting mode; the second pixel definition layer 25 of the second panel 20 is arranged on the side of the second substrate 23 away from the first panel 10. That is, a side of the second substrate 23 is attached to the first panel 10 by a sealing adhesive layer, the second pixel definition layer 25 is arranged on the side of the second substrate 23 away from the sealing adhesive layer, and light is emitted directly upwards from the second pixel definition layer 25.

In the above embodiment, on the first panel 10, the drive current of the second pixel unit 32 is greater than the drive current of the first pixel unit 31, i.e., the pixel driving circuit 150 provides a drive current to the second pixel unit 32 that is greater than the drive current provided to the first pixel unit 31. Since the light of the second pixel unit 32 is required to pass through the first light guide layer 41, the sealing adhesive layer, the second light guide layer 42, and the second substrate 23, there will be a certain amount of light loss, which is prone to cause the display brightness of the overlapping region to be dark. In response to this problem, the embodiment of the present disclosure improves the brightness of the second pixel region 12 by making the drive current of the second pixel unit 32 greater than the drive current of the first pixel unit 31, so as to compensate the brightness of the overlapping region, such that the brightness of the overlapping region is consistent with the brightness of the other regions, enhancing the display effect. Specifically, a specific magnitude of the drive current of the second pixel unit 32 may be set according to a brightness difference between the overlapping region and the other regions, where a greater absolute value of the brightness difference indicates that the overlapping region is darker, the greater the drive current of the second pixel unit 32; vice versa, the less the brightness difference between the overlapping region and the other regions is, the less the difference between the drive current of the second pixel unit 32 and the drive current of the first pixel unit 31.

Figure 8:
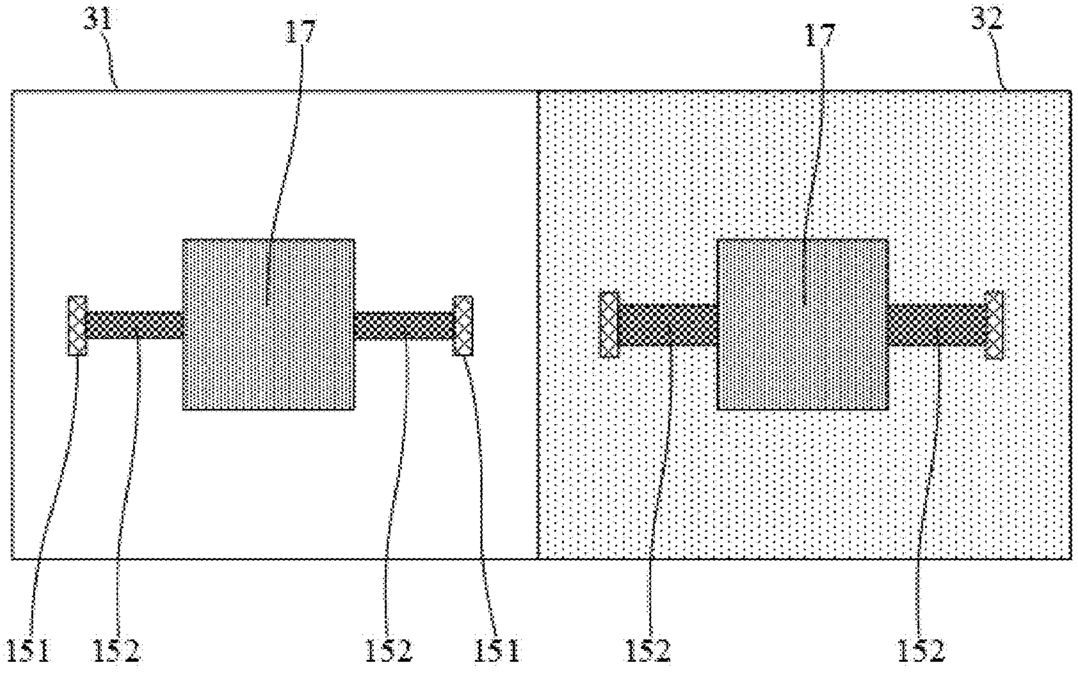
FIG. 8 is a schematic view of a partial planar structure of a first panel according to some embodiments of the present disclosure.

Referring to FIGS. 6 and 8, FIG. 8 is a schematic view of a partial planar structure of a first panel according to some embodiments of the present disclosure. In the embodiments, the line width of the signal connection line 152 of the second pixel region 12 is greater than the line width of the signal connection line 152 of the first pixel region 11, i.e., the second line width of the signal connection line 152 electrically connected to the second pixel unit 32 is greater than the first line width of the signal connection line 152 electrically connected to the first pixel unit 31, thereby reducing a load of the signal connection line 152, and thus reducing the heat generation around the second pixel units 32.

Further, the aperture of the adapter hole 154 of the second pixel region 12 is greater than the aperture of the adapter hole 154 of the first pixel region 11, i.e., the second aperture of the adapter hole 154 electrically connected to the signal connection line 152 of the second pixel unit 32 is greater than the first aperture of the adapter hole 154 electrically connected to the signal connection line 152 of the first pixel unit 31, thereby further reducing the load of the line, and thus reducing the heat generation around the second pixel units 32.

It can be understood that the first panel 10 may easily cause the second pixel units 32 to be susceptible to heat generation compared to the first pixel units 31 by making the drive current of the second pixel unit 32 greater than the drive current of the first pixel unit 31. In response to this problem, the present embodiments of the present disclosure reduces the heat generation around the second pixel units 32 by making the line width of the signal connection line 152 of the second pixel region 12 greater than the line width of the signal connection line 152 of the first pixel region 11 and by making the aperture of the adapter hole 154 of the second pixel region 12 greater than the aperture of the adapter hole 154 of the first pixel region 11 to reduce the line load of the pixel driving circuit 150 of the second pixel region 12.

Referring again to FIGS. 1 and 7, specifically, the first panel 10 may further include a first reflective layer 181 disposed between the first substrate 14 and the first circuit layer 15 and located in the second pixel region 12 for reflecting the light from the second pixel region 12, compensating the display brightness of the second pixel region 12, and thereby improving the brightness of the overlapping region of the display panel 100. Specifically, the first reflective layer 181 is made of a material including a metal or a metal oxide material, such that the first reflective layer 181 may further be configured to dissipate heat from the second pixel region 12 to overcome the problem that the second pixel region 12 is prone to heat generation.

Further, as shown in FIG. 6, the first panel 10 may further include a second reflective layer 182 disposed on a sidewall of the first black matrix 161, for reflecting the light in the first pixel opening 162, and improving the transmittance rate of the first panel 10, thereby improving the brightness of the first panel 10, and avoiding the problem of inconsistency in the display brightness due to a height difference between the first panel 10 and the second panel 20 problem, so as to make the display brightness of each spliced panel of the display panel 100 consistent and further enhance the display effect.

Figure 9:
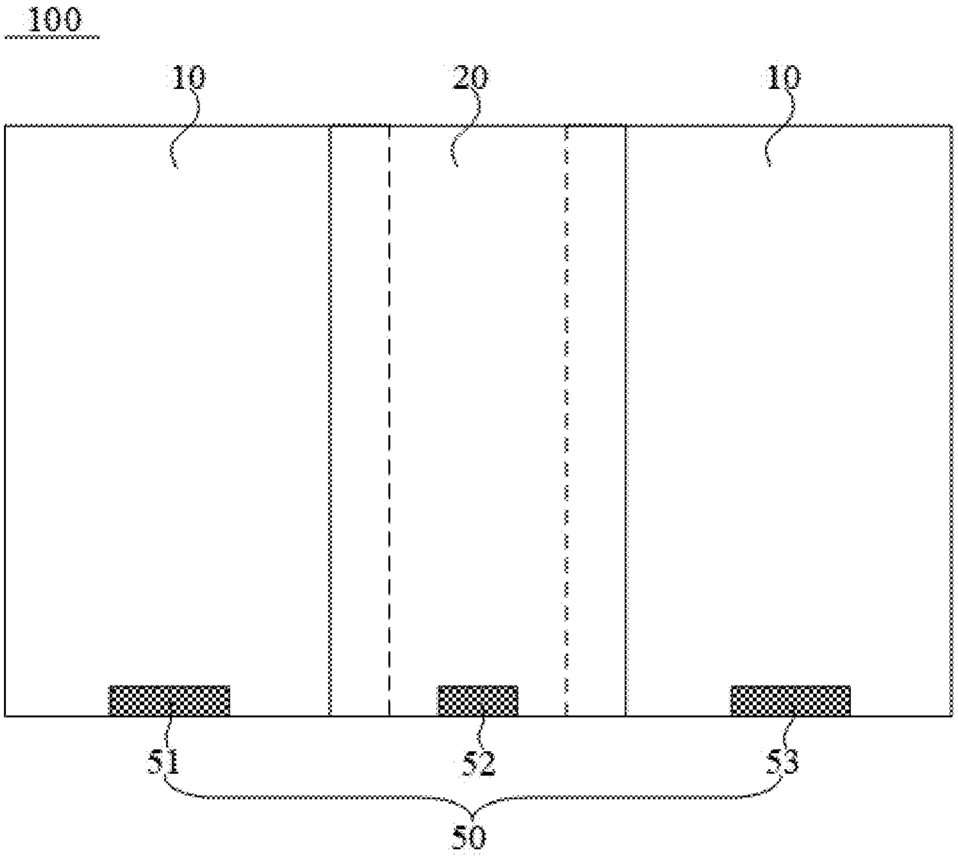
FIG. 9 is a schematic view of a planar structure of a display panel according to a third embodiment of the present disclosure.

Referring to FIG. 9, FIG. 9 is a schematic view of a planar structure of a display panel according to a third embodiment of the present disclosure. In the embodiments, each of the first panel 10 and the second panel 20 further includes a signal input terminal 50. The display panel formed by splicing two first panels 10 and one second panel 20 is illustrated as an example: according to a direction from left to right, the first panel 10 on the left includes a first input terminal 51, the second panel 20 includes a second input terminal 52, the first panel 10 on the right includes a third input terminal 54. The first input terminal 51, the second input terminal 52, and the third input terminal 54 are arranged at the bottom of the respective panels and are electrically connected to the respective circuit layers for inputting the desired drive signals. The first input terminal 51 and the third input terminal 54 are configured to receive scanning signals, data signals, power signals, etc. required by the first panel 10, and the second input terminal 52 is configured to receive scanning signals, data signals, power signals, etc. required by the second panel 20. By means of the foregoing setup, it is possible to enable each panel to be driven individually without the need to make alignment connections between the respective panels, which not only reduces the manufacturing process, but also avoids problems such as breakage or short-circuiting of the connection lines between the panels due to splicing.

Specifically, in the embodiments, the first pixel units 31, the second pixel units 32, and the third pixel units 33 on the display panel 100 form a q×p pixel matrix; where the first panel 10 on the left includes 1~n columns, the second panel 20 includes (n+1)~m columns, and the first panel 10 on the right includes (m+1)~p columns. When the display panel 100 displays an image, the first input terminal 51 inputs scanning signals Gate(1)~Gate(q) (i.e., scanning signals for the 1st~qth row), data signals Date(1)~Date(n) to the first panel 10 on the left, the second input terminal 52 inputs scanning signals Gate(1)~Gate(q), data signals Date(n+1)~Date(m) to the second panel 20, and the third input terminal 54 inputs scanning signals Gate(1)~Gate(q), and data signals Date(m+1)~Date(p) to the first panel 10 on the right side, thereby displaying a complete picture. Among them, q, p, m, and n are positive integers.

In other embodiments, similar to that in the above embodiments, each panel includes a signal input terminal 50, which can be driven individually according to the slicing method of the panels when displaying a screen, which may be referred to the specific introduction of the above embodiments and will not be repeated herein.

Figure 10:
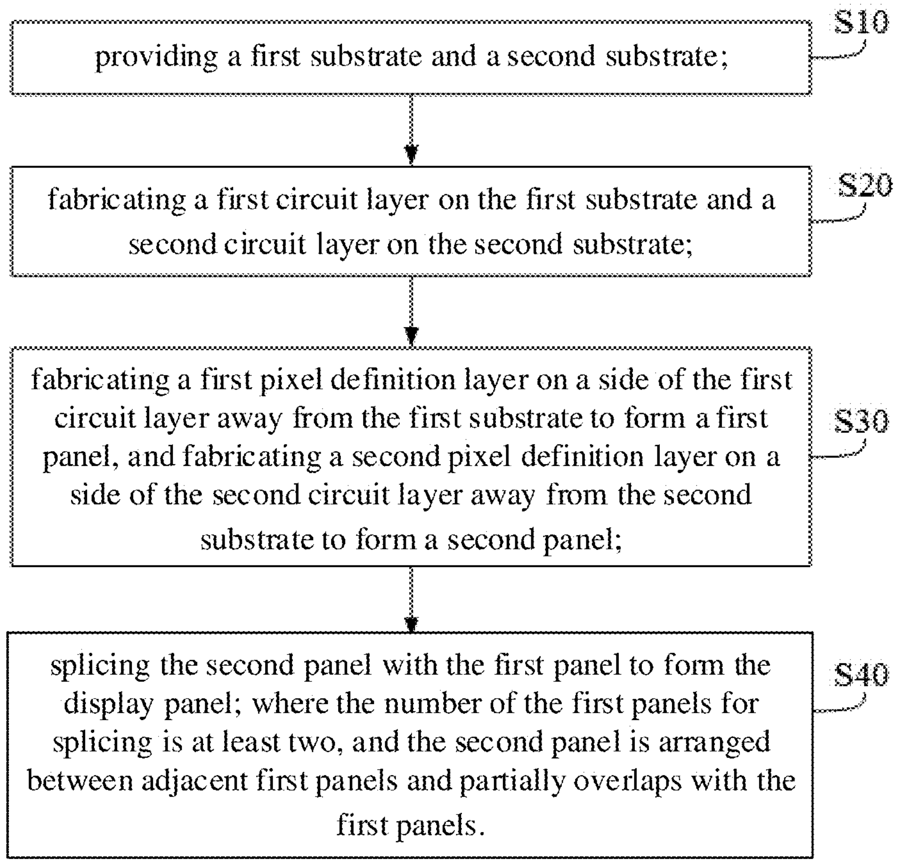
FIG. 10 is a flowchart of a preparation method for a display panel according to some embodiments of the present disclosure.

Referring to FIG. 10, FIG. 10 is a flowchart of a preparation method for a display panel according to some embodiments of the present disclosure. In the embodiments, a method of preparing a display panel 100 is provided for preparing the display panel 100 in the above embodiments, the preparation method including the following operations at blocks illustrated herein.

At block S10: providing a first substrate 14 and a second substrate 23;

At block S20: fabricating a first circuit layer 15 on the first substrate 14 and a second circuit layer 24 on the second substrate 23;

At block S30: fabricating a first pixel definition layer 16 on a side of the first circuit layer 15 away from the first substrate 14 to form a first panel 10, and fabricating a second pixel definition layer 25 on a side of the second circuit layer 24 away from the second substrate 23 to form a second panel 20;

At block S40: splicing the second panel 20 with the first panel 10 to form the display panel 100; where the number of the first panels 10 for splicing is at least two, and the second panel 20 is arranged between adjacent first panels 10 and partially overlaps with the first panels 10.

Specifically, the display panel 100 made by this method is the display panel 100 as described in the above embodiments. The display panel 100 includes at least two first panels 10 and a second panel 20; where the at least two first panels 10 are spliced and a gap 13 is defined between two adjacent first panels 10; the second panel 20 is arranged between the two adjacent first panels 10 to form the display panel 100 by splicing. The display panel 100 may meet a large-size requirement, thereby realizing a seamless splicing display.

The first substrate 14 and the second substrate 23 may be a glass substrate, the thickness of the first substrate 14 may be 0.3-0.6 mm, and the thickness of the second substrate 23 may be 0.2-0.4 mm, such that the sum of the thicknesses of the first panel 10 and the second panel 20 is less than 1 mm.

Specifically, step S20 specifically includes the following.

S21: dividing a first pixel region 11 and a second pixel region 12 on the first substrate 14, the second pixel region 12 being a region to be overlapped with the second panel 20;

S22: fabricating a pixel driving circuit 150 in the first pixel region 11 and the second pixel region 12; where a line width of a signal connection line 152 in the second pixel region 12 is greater than a line width of a signal connection line 152 in the first pixel region 11, and an aperture of an adapter hole 154 in the second pixel region 12 is greater than an aperture of a signal adapter hole 154 in the first pixel region 11;

S23: dividing a third pixel region 21 and a fourth pixel region 22 on the second substrate 23, the fourth pixel region 22 being a region to be overlapped with the second pixel region 12;

S24: fabricating a pixel driving circuit 150 in the third pixel region 21.

The above steps are performed in order to form the pixel driving circuit 150 described in the above embodiments, and specifically, the specific structure and function of the pixel driving circuit 150 is the same or similar to that of the pixel driving circuit 150 in the above embodiments, and the same technical effect can be realized, which may be referred to in detail above and will not be repeated herein.

Specifically, step S30 specifically includes the following.

S31: fabricating a first black matrix 161 on a side of the first circuit layer 15 away from the first substrate 14 to define a first pixel opening 162;

S32: transferring a first light-emitting unit 17 into the first pixel opening 162 and binding the first light-emitting unit 17 to the pixel driving circuit 150 to form a first pixel unit 31 and a second pixel unit 32;

S33: filling a first light guide adhesive in the first pixel opening 162 to form a first light guide layer 41;

S34: fabricating a second black matrix 251 on a side of the second circuit layer 24 away from the second substrate 23 to form a second pixel opening 252;

S35: transferring a second light-emitting unit 27 into the second pixel opening 252 of the third pixel region 21 and binding the second light-emitting unit 27 to the pixel driving circuit 150 to form a third pixel unit 33 and a virtual pixel unit 34;

S36: filling a second light guide adhesive in the second pixel opening 252 to form a second light guide layer 42.

The above steps are performed in order to form the first pixel definition layer 16 and the second pixel layer described in the above embodiments, thereby forming the first panel 10 and the second panel 20, and specifically, the specific structure and function of the first pixel definition layer 16 and the second pixel definition layer 25 are the same as or similar to those of the first pixel definition layer 16 and the second pixel definition layer 25 as described in the above embodiments, and may realize the same technical effects, which may be described in detail above and will not be repeated herein.

Specifically, step S40 specifically includes the following.

S41: placing at least two the first panels 10 to be spliced according to a splicing layout, and fixing a spacing between adjacent first panels 10 by means of a module;

S42: applying a sealing adhesive to the second panel 20 to form a sealing adhesive layer;

S43: attaching the second panel 20 to the first panels 10 through the sealing adhesive layer such that the second panel 20 is disposed between the adjacent first panels 10, and the virtual pixel units 34 and the second pixel unit s32 are disposed and overlapped in one-to-one correspondence.

When the second panel 20 is in a bottom-emitting display mode, the sealing adhesive is applied to the side of the second pixel definition layer 25 away from the second substrate 23 in step S42; when the second panel 20 is in a top-emitting display mode, the sealing adhesive is applied to the side of the second substrate 23 away from the second pixel definition layer 25 in step S42, such that the light output direction of the second panel 20 is the same as the light output direction of the first panel 10.

Further, before step S22, the preparation method further includes the following.

S11: fabricating a first reflective layer 181 in the second pixel region 12 of the first substrate 14;

S12: fabricating a transparent insulating layer on a side of the first reflective layer 181 away from the first substrate 14.

The first reflective layer 181 formed by the above steps may be configured to reflect light from the second pixel unit 32 to compensate for the brightness of the second pixel region 12. The specific material as well as the structure and function of the first reflective layer 181 are the same as or similar to the first reflective layer 181 involved in the above embodiments, and may realize the same technical effect, which may be referred to in detail above and will not be repeated herein.

In other embodiments, the first reflective layer 181 may be made in both the first pixel region 11 and the second pixel region 12 on the first substrate 14 to improve the light utilization rate and increase the brightness of the first panel 10.

Further, after steps S31 and S32, the preparation method further includes the following.

S13: fabricating a second reflective layer 182 on a sidewall of the first black matrix 161 and on a sidewall of the second black matrix 251.

The second reflective layer 182 formed by the above step may be configured to reflect light within each pixel unit, thereby increasing the transmittance rate of the display panel 100 and improving the display brightness. Specifically, the material of the second reflective layer 182 may be an organic photoresist material containing metal oxide nanoparticles to insulate the second reflective layer 182 from the pixel driving circuits 150 and avoid shorting the second reflective layer 182 from the pad 153 within the pixel opening.

Further, in the process of preparing the second panel 20, the method further includes the following.

S14: fabricating a third reflective layer under the third pixel unit 33.

Specifically, when the second panel 20 is in a bottom-emitting display mode, step S14 may be followed by step S36 to fabricate the third reflective layer on the second light-guiding layer 42; when the second panel 20 is in a top-emitting display mode, step S14 may be followed by step S23 to fabricate the third reflective layer in the third pixel region 21 of the second substrate 23 and fabricate the transparent insulating layer on the side of the third reflective layer away from the second substrate 23, to avoid that the pixel driving circuit 150 is abnormal caused by the third reflective layer shorting to the pixel driving circuit 150.

The display panel 100 prepared by the preparation method in the above embodiments is capable of forming a large-size display panel 100 by splicing multiple panels, thereby realizing a large-size display; and it is capable of realizing seamless splicing, thereby avoiding the phenomenon of displaying a dark line or a discontinuous picture due to the existence of splicing seams. The splicing position can realize a pixel-level display, thereby avoiding the decrease in contrast due to splicing, and improving the display effect of the display panel 100.

Figure 11:
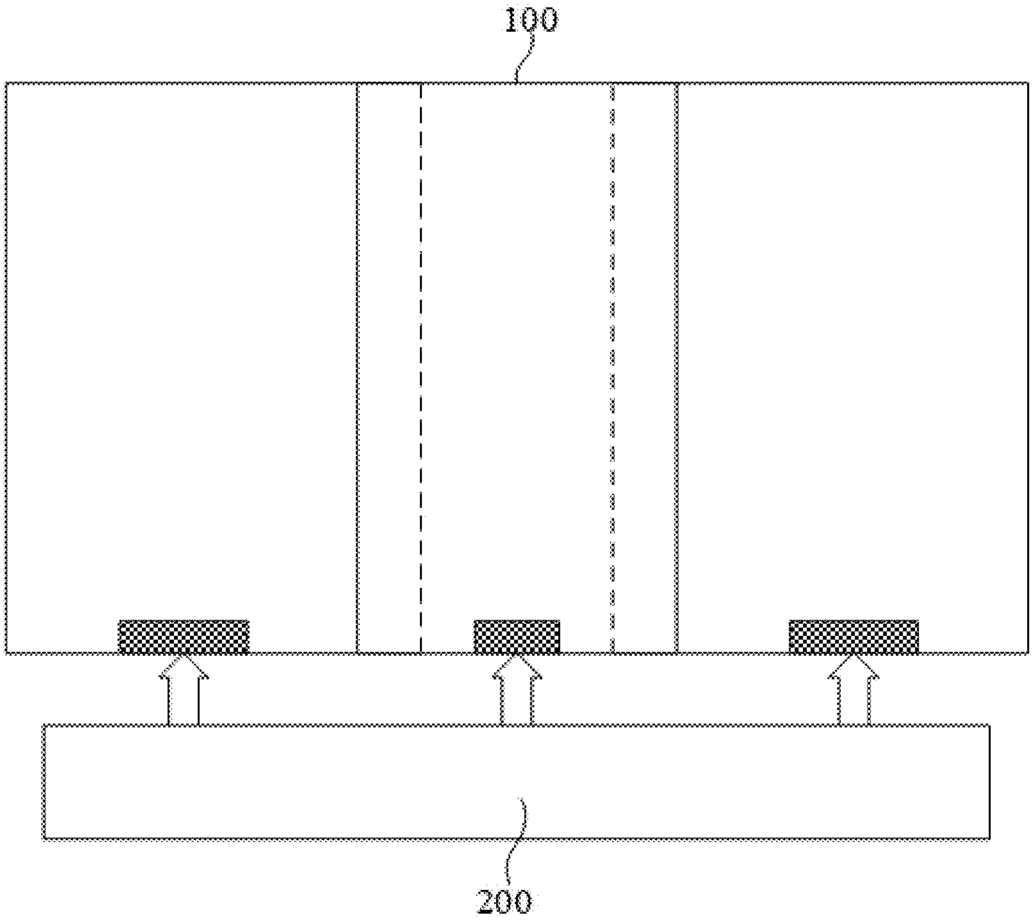
FIG. 11 is a structural schematic view of a display device according to some embodiments of the present disclosure.

Referring to FIG. 11, FIG. 11 is a structural schematic view of a display device according to some embodiments of the present disclosure. In this embodiment, a display device is provided, the display device including a display panel 100 and a control module 200. The display panel 100 is configured to display an image, specifically, the specific structure and function of the display panel 100 is the same as or similar to that of the display panel 100 as related to the embodiments above, and may realize the same technical effect. Further, the display panel 100 may be made by the preparation method provided by the embodiments above. The specific structure and technical effects that can be realized by the display panel 100, as well as the preparation method can be described in detail with reference to the above embodiments, which will not be repeated herein.

The control module 200 is electrically connected to the display panel 100 for controlling the display panel 100 and providing the display panel 100 with a drive signal required by the display panel 100 such as scanning signal, data signal, common electrode signal, clock signal, power signal, etc., so as to control the display panel 100 to display the image.

The beneficial effect of the present disclosure: distinguished from the related art, the present disclosure provides a display panel and a display device, the display panel including at least two first panels and a second panel. By making the at least two first panels spliced with each other, and making the second panel disposed between the two neighboring first panels and providing the third pixel region in a region corresponding to the gap, the first panel can display an image together with the second panel, thereby eliminating the display of a dark line or a discontinuous picture and realizing a seamless splicing display. By making the fourth pixel region of the second panel overlapped with the second pixel region of the first panel, i.e., by making the edge portions on opposite sides of the second panel overlapped with the first panel, the connection between the second panel and the first panel may be more reliable, thereby avoiding a discontinuous picture caused by the misalignment of the second panel. Furthermore, by making the fourth pixel region includes multiple virtual pixel units and by making the virtual pixel units one-to-one corresponding to and overlapped with the second pixel units, light from the second pixel units can pass through the corresponding virtual pixel units, such that the overlapping region between the second panel and the first panel can be displayed normally, avoiding the problem of display abnormality due to overlapping. Moreover, by making the virtual pixel units one-to-one corresponding to the second pixel units on the first substrate, no color stringing problem between pixels will be caused, so as to improve the contrast of the display panel.

The above is only some embodiments of the present disclosure, and is not intended to limit the scope of the present disclosure. Any equivalent structure or equivalent process transformation utilizing the contents of the specification and the accompanying drawings of the present disclosure, or directly or indirectly utilized in other related technical fields, are all similarly included in the scope of the present disclosure.

What is claimed is:

1. A display panel, comprising:

at least two first panels; wherein the at least two first panels are spliced, and a gap is defined between each adjacent two of the at least two first panels; and a second panel, arranged between the adjacent two of the at least two first panels;

wherein for each of the adjacent two of the at least two first panels, the first panel comprises a first pixel region and a second pixel region, the second pixel region being located on a side of the first pixel region near the gap; the first pixel region comprises a plurality of first pixel units, the second pixel region comprises a plurality of second pixel units;

the second panel comprises a third pixel region and two fourth pixel regions, the third pixel region facing the gap, and the two fourth pixel regions being located on opposite sides of the third pixel region and overlapping with the second pixel regions on opposite sides of the gap; the third pixel region comprises a plurality of third pixel units, and each of the two fourth pixel regions comprises a plurality of virtual pixel units; the plurality of virtual pixel units faces and overlaps with the plurality of second pixel units in a one-to-one correspondence, and light from each of the plurality of second pixel units is capable of passing through a corresponding virtual pixel unit.

2. The display panel according to claim 1, wherein along a direction of the first pixel region approaching the gap, the plurality of second pixel units of the second pixel region are arrayed in at least two columns, and the plurality of virtual pixel units of each of the two fourth pixel regions are arrayed in at least two columns.

3. The display panel according to claim 1, wherein the plurality of first pixel units and the plurality of second pixel units are referred to pixel units on the first panel, and a distance between each adjacent two columns of the pixel units on the first panel is a first pixel distance d1; a distance between two columns of the plurality of second pixel units of the second pixel regions is an integer multiplier of the first pixel distance d1, where the two columns of the plurality of second pixel units are on the opposite sides of the gap.

4. The display panel according to claim 1, wherein the first panel and the second panel are attached to each other by a sealing adhesive layer, and a sum of thicknesses of the first panel, the sealing adhesive layer, and the second panel is less than 1 mm.

5. The display panel according to claim 1, wherein the first panel comprises a first substrate, a first circuit layer, and a first pixel definition layer sequentially stacked; the first pixel definition layer comprises a first black matrix, a first light-emitting unit, and a first light guide layer; the first black matrix defines a plurality of first pixel openings, and each of the plurality of first pixel openings is arranged with the first light-emitting unit to form the plurality of first pixel units and the plurality of second pixel units; the first light guide layer is filled in each of the plurality of first pixel openings for gathering light in each of the plurality of first pixel openings;

the second panel comprises a second substrate, a second circuit layer, and a second pixel definition layer sequentially stacked; the second pixel definition layer is disposed on a side of the second substrate near the first panel or a side of the second substrate away from the first panel; the second pixel definition layer comprises a second black matrix, a second light-emitting unit, and a second light guide layer; the second black matrix defines a plurality of second pixel openings; some of the plurality of second pixel openings located in the third pixel region are each arranged with the second light-emitting unit to form the plurality of third pixel units; the second light guide layer is filled in each of the plurality of second pixel openings for gathering light in each of the plurality of second pixel openings.

6. The display panel according to claim 5, wherein the first circuit layer comprises a plurality of pixel driving circuits, the pixel plurality of driving circuits being in a one-to-one correspondence with and electrically connected to the light-emitting units, for providing a drive current to each of the plurality of first pixel units and the plurality of second pixel units; the drive current of each of the plurality of second pixel units is greater than the drive current of each of the plurality of first pixel units.

7. The display panel according to claim 6, wherein each of the plurality of pixel driving circuits comprises a driving signal line and a signal connection line, an end of the signal connection line being electrically connected to the first light-emitting unit through a pad, and the other end of the signal connection line being electrically connected to the driving signal line though an adapter hole;

wherein a line width of the signal connection line in the second pixel region is greater than a line width of the signal connection line in the first pixel region, and an aperture of the adapter hole in the second pixel region is greater than an aperture of the adapter hole in the first pixel region.

8. The display panel according to claim 7, wherein the driving signal line comprises an operating voltage signal line and a common electrode signal line; the signal connection line comprises a first connection line and a second connection line; the first connection line is electrically connected to the operating voltage signal line, and the second connection line is electrically connected to the common electrode signal line; the pad is arranged in an uppermost layer of the first circuit layer, and the pad comprises a first pad and a second pad; the first pad is electrically connected to the first connection line, and the second pad is electrically connected to the second connection line.

9. The display panel according to claim 5, wherein the first panel further comprises a first reflective layer disposed between the first substrate and the first circuit layer and located in the second pixel region or in the first pixel region and the second pixel region; the first reflective layer is made of a material comprising a metal or a metal oxide.

10. The display panel according to claim 5, wherein the first panel further comprises a second reflective layer disposed on a sidewall of the first black matrix.

11. The display panel according to claim 1, wherein the second panel comprises a second black matrix, defining a plurality of second pixel openings; the plurality of second pixel openings are in a one-to-one correspondence with the plurality of third pixel units and the plurality of virtual pixel units; some of the plurality of second pixel openings located in the two fourth pixel region are not arranged with any light-emitting unit to form the plurality of virtual pixel units.

12. The display panel according to claim 11, wherein each of the plurality of first pixel units and the plurality of second pixel units is arranged with a first light-emitting unit, and each of the plurality of third pixel units is arranged with a second light-emitting unit; the first light-emitting unit and the second light-emitting unit are each a current-driven light-emitting device;

each of the first panel and the second panel further comprises a signal input terminal, the signal input terminal being electrically connected to a circuit layer of a corresponding one of the first panel and the second panel, for receiving a scanning signal, a data signal, and a power signal required by the corresponding one of the first panel and the second panel.

13. The display panel according to claim 1, wherein a gap width of the gap is 5-100 mm.

14. The display panel according to claim 1, wherein the third pixel region is arranged with a light-shielding layer made of a light-absorbing material or a reflective material.

15. A display device, comprising:

a display panel, for displaying an image; and a control module, electrically connected to the display panel and configured to control the display panel;

wherein the display panel comprises:

at least two first panels; wherein the at least two first panels are spliced, and a gap is defined between each adjacent two of the at least two first panels; and a second panel, arranged between the adjacent two of the at least two first panels;

wherein for each of the adjacent two of the at least two first panels, the first panel comprises a first pixel region and a second pixel region, the second pixel region being located on a side of the first pixel region near the gap; the first pixel region comprises a plurality of first pixel units, the second pixel region comprises a plurality of second pixel units;

the second panel comprises a third pixel region and two fourth pixel regions, the third pixel region facing the gap, and the two fourth pixel regions being located on opposite sides of the third pixel region and overlapping with the second pixel regions on opposite sides of the gap; the third pixel region comprises a plurality of third pixel units, and each of the two fourth pixel regions comprises a plurality of virtual pixel units; the plurality of virtual pixel units faces and overlaps with the plurality of second pixel units in a one-to-one correspondence, and light from each of the plurality of second pixel units is capable of passing through a corresponding virtual pixel unit.

16. The display device according to claim 15, wherein along a direction of the first pixel region approaching the gap, the plurality of second pixel units of the second pixel region are arrayed in at least two columns, and the plurality of virtual pixel units of each of the two fourth pixel regions are arrayed in at least two columns.

17. The display device according to claim 15, wherein the plurality of first pixel units and the plurality of second pixel units are referred to pixel units on the first panel, and a distance between each adjacent two columns of the pixel units on the first panel is a first pixel distance d1; a distance between two columns of the plurality of second pixel units of the second pixel regions is an integer multiplier of the first pixel distance d1, where the two columns of the plurality of second pixel units are on the opposite sides of the gap.

18. The display device according to claim 15, wherein the first panel and the second panel are attached to each other by a sealing adhesive layer, and a sum of thicknesses of the first panel, the sealing adhesive layer, and the second panel is less than 1 mm.

19. The display device according to claim 15, wherein the first panel comprises a first substrate, a first circuit layer, and a first pixel definition layer sequentially stacked; the first pixel definition layer comprises a first black matrix, a first light-emitting unit, and a first light guide layer; the first black matrix defines a plurality of first pixel openings, and each of the plurality of first pixel openings is arranged with the first light-emitting unit to form the plurality of first pixel units and the plurality of second pixel units; the first light guide layer is filled in each of the plurality of first pixel openings for gathering light in each of the plurality of first pixel openings;

the second panel comprises a second substrate, a second circuit layer, and a second pixel definition layer sequentially stacked; the second pixel definition layer is disposed on a side of the second substrate near the first panel or a side of the second substrate away from the first panel; the second pixel definition layer comprises a second black matrix, a second light-emitting unit, and a second light guide layer; the second black matrix defines a plurality of second pixel openings; some of the plurality of second pixel openings located in the third pixel region are each arranged with the second light-emitting unit to form the plurality of third pixel units; the second light guide layer is filled in each of the plurality of second pixel openings for gathering light in each of the plurality of second pixel openings.

20. A display panel, comprising:

two first panels; wherein the at least two first panels are spliced, and a gap is defined between the two first panels; and a second panel, arranged on the two first panels; wherein two overlapping regions are defined on opposites sides of the second panel, and in each overlapping region, a part of the second panel is overlapped with a part of a corresponding first panel;

wherein in each overlapping region, the second panel is arranged with a plurality of virtual pixel units with no light-emitting units, and the corresponding first pixel is arranged with a plurality of pixel units each with a light-emitting unit; the plurality of virtual pixel units face the plurality of pixel units in a one-to-one correspondence; light from each of the plurality of pixel units is capable of passing through a corresponding virtual pixel unit;

in a region other than the two overlapping regions on the second panel, the second panel is further arranged with a plurality of other pixel units each with a light-emitting unit.

* * * * *